(12) United States Patent
Burkhardt

(10) Patent No.: US 8,366,947 B2
(45) Date of Patent: Feb. 5, 2013

(54) METHOD FOR TRANSFERRING NANOSTRUCTURES INTO A SUBSTRATE

(75) Inventor: Claus Burkhardt, Tuebingen (DE)

(73) Assignee: NMI Naturwissenschaftliches und Medizinisches Institut an der Universitaet Tuebingen, Reutlingen (DE)

( * ) Notice: Subject to any disclaimer, the term of this patent is extended or adjusted under 35 U.S.C. 154(b) by 0 days.

(21) Appl. No.: 13/027,183

(22) Filed: Feb. 14, 2011

(65) Prior Publication Data

US 2011/0135881 A1 Jun. 9, 2011

Related U.S. Application Data

(63) Continuation of application No. PCT/EP2009/005773, filed on Aug. 8, 2009.

(30) Foreign Application Priority Data

Aug. 15, 2008 (DE) .................... 10 2008 039 798

(51) Int. Cl.
*H01B 13/00* (2006.01)

(52) U.S. Cl. ............ 216/17; 216/19; 216/39; 216/57

(58) Field of Classification Search .............. 216/17, 216/19, 39, 57

See application file for complete search history.

(56) References Cited

U.S. PATENT DOCUMENTS

| | | | |
|---|---|---|---|
| 2003/0116531 A1* | 6/2003 | Kamins et al. ............ | 216/41 |
| 2004/0097040 A1* | 5/2004 | Kamins ..................... | 438/270 |
| 2005/0202587 A1 | 9/2005 | Redecker et al. | |
| 2007/0116989 A1* | 5/2007 | Ikekame et al. .......... | 428/828.1 |
| 2008/0038732 A1* | 2/2008 | Hah et al. ................. | 435/6 |
| 2008/0073505 A1* | 3/2008 | Niu et al. ................. | 250/288 |
| 2008/0075954 A1* | 3/2008 | Wardle et al. ........... | 428/339 |

FOREIGN PATENT DOCUMENTS

| | | |
|---|---|---|
| EP | 1 811 302 A1 | 1/2006 |
| JP | 11066654 | 3/1999 |
| WO | WO 02/29912 A1 | 4/2002 |
| WO | WO 2004/097894 A2 | 11/2004 |
| WO | WO 2007/053202 A2 | 5/2007 |

OTHER PUBLICATIONS

Chau and Melvin "The fabrication of macroporous polysilicon by nanosphere lithography," *J. Micromech. Microeng,* 18, pp. 064012 (2008).

Fischer and Zingsheim "Submicroscopic pattern replication with visible light," *J. Vac. Sci. Technolo.,* 19(4):881-885 (1981).

Han et al. "Controllable two-dimensional photonic crystal patterns fabricated by nanosphere lithography," *J. Vac. Sci. Technol.,* 23(4):1585-1588 (2005).

Hulteen and Van Duyne "Nanosphere lithography: A materials general fabrication process for periodic particle array surfaces," *J. Vac. Sci. Technol.,* 13(3):1553-1558 (1995).

Kim et al. "Increase of light extraction from GaN based light emitting diodes incorporating patterned structure by colloidal lithography," *Applied Physical Letters,* 91, pp. 171114 (2007).

Weekes and Ogrin "Torque studies of large-area Co arrays fabricated by etched nanosphere lithography," *Journal of Applied Physics,* 97(10), pp. 10J503 (2005).

Zheng and Wang "Fabrication of tunable nanostructure arrays using ion-polishing-assisted nanosphere lithography," *Journal of Applied Physics,* 99, pp. 034308 (2006).

* cited by examiner

*Primary Examiner* — Binh X Tran

(74) *Attorney, Agent, or Firm* — Klarquist Sparkman, LLP

(57) ABSTRACT

In a method for transferring nanostructures into a substrate, the following order of steps is used: decorating a substrate with nanomaterials (13), etching the substrate (10), applying a coating (15), removing the nanomaterials (13), and etching the substrate (10).

35 Claims, 3 Drawing Sheets

METHOD FOR TRANSFERRING NANOSTRUCTURES INTO A SUBSTRATE

RELATED APPLICATION

This is a continuation application of International Patent Application PCT/EP2009/005773, filed Aug. 8, 2009, designating the United States and published in English as WO 2010/017934, which claims priority of German patent application DE 10 2008 039 798.9, filed Aug. 15, 2008. The entire contents of these prior applications are incorporated herein by reference.

BACKGROUND OF THE INVENTION

1. Field of the Invention

The present invention relates to a method for transferring nanostructures into a substrate, in which method nanomaterials are used as a shadow mask for applying a coating.

Furthermore, the invention relates to a surface comprising transferred nanostructures, which surface has been produced according to a method according to the invention, a membrane, an electrode device or a biosensor which have such a surface, and also a device having a surface, membrane, electrode device and/or biosensor according to the invention.

2. Related Prior Art

The production of nanostructures having dimensions of less than 100 nm (electron beam lithography, focused ion beam lithography, UV lithography, X-ray lithography) requires very expensive lithography apparatuses. The economic and reliable production of components having such nanostructures (e.g. filter membranes having monodisperse pore distribution having dimensions of 20 nm to approximately 500 nm) therefore requires new production technologies. If these structures are intended to be produced periodically and over relatively large areas, an appropriate alternative to conventional lithography methods, such as photolithography, electron beam lithography or nanoimprint lithography, for example, is the method of particle lithography; Fischer and Zingsheim, J. Vac. Sci. Technol., 19(4), November-December 1981.

Various methods in which nanostructures are transferred to substrates by means of particle lithography are known in the prior art.

JP 11066654 describes a method in which, in a first step, nanomaterials are applied to a substrate coated with an adhesive layer in order to bind the nanomaterials. In a second step, nanostructures are transferred into the substrate by etching, and in a further etching step the nanomaterials and the adhesive layer are removed.

The abovementioned publication "Submicroscopic pattern replication with visible light" (Fischer and Zingsheim, 1981) describes a method for producing a nanostructured exposure mask in which a glass substrate is decorated with nanomaterials in a first step, a coating with a metal is applied in a second step, and the nanomaterials are removed in a third step.

The publication "Nanosphere lithography: A materials general fabrication process for periodic particle array surfaces" (Hulteen and Van Duyne, 1995, J. Vasc. Sci. Technol. A 13(3)) describes a method for producing periodic particle structures on a substrate. In this case, the substrate is decorated with a one- or two-layered periodic arrangement of nanomaterials in a first step, a coating is applied in a second step, and the nanomaterials are removed from the surface in a third step.

The known methods all have different disadvantages, however. Thus, in particular a problem with regard to the removal of the nanomaterials used as a mask arises in the known methods for particle lithography.

By way of example, it is known from the abovementioned publications by Fischer and Zingsheim as well as by Hulteen and Van Duyne to remove the nanomaterials from the substrate by means of irradiation with ultrasound. What is disadvantageous in this case is that when the ultrasonic power is set too low, particles adhere on the substrate and are only partly removed. If the power is too high, by contrast, not only the particles but also the applied coating is partly removed. On account of the process-inherent unequal extent of ultrasonic intensities, it is thus only possible to implement these methods with a low number of defects on areas on the sub-millimetre scale.

Furthermore, JP 11066654 mentioned above describes removing the nanomaterials by means of plasma etching. What is disadvantageous in this case is that the substrate surface itself is also altered by the etching process.

A further method for removing nanomaterials from a coated surface is described in the abovementioned publication by Hulteen and Van Duyne. This method involves lifting off the nanomaterials with adhesive film from the coated substrate.

This method also has disadvantages. A defect-free lift-off of the nanomaterials is possible only on extremely small areas of less than 1 mm$^2$. Furthermore, there is also the risk here of the underlying coating being damaged as a result of detachment from the substrate.

A further problem of the known methods is the restriction with regard to the lower limit of the resolution. Thus, only nanostructures which have a significantly larger extent than the thickness of the applied coating can be transferred into the substrate by the known methods. The reason for this is that during the application of the coating, smaller nanomaterials would be completely or substantially embedded into the coating, and would thereupon no longer be removable.

SUMMARY OF THE INVENTION

In view of the above, it is an object of the present invention to provide a method in which nanostructures are transferred into a substrate by means of particle lithography, which method completely or partly avoids the disadvantages known in the prior art.

In the case of the method mentioned at the outset, this object is achieved by the following order of steps:
a) decorating a substrate with nanomaterials;
b) etching the substrate or the substrate and the nanomaterials;
c) applying a coating;
d) removing the nanomaterials; and
e) etching the substrate.

The object underlying the invention is completely achieved in this way.

Specifically, the inventor has recognized that the disadvantages from the prior art can be avoided by applying the coating in such a way that it lies below the level of the original substrate surface. After the etching and coating processes, the nanomaterials still lie at the level of the original substrate surface and can be removed from the latter without the deeper coating being damaged.

What is advantageous in this case, therefore, is that a three-dimensional surface is produced in the first etching step after the substrate has been decorated with nanomaterials, the decorating nanomaterials being situated on columns of the surface.

It is thus possible, for example, to remove the nanomaterials from the surface by means of polishing. Specifically, the patterned surface produced in step b) makes it possible to ensure that the coating produced in step c) is not damaged during polishing in step d). Specifically, as a result of a polishing cloth or a polishing roller bearing on the columns produced in step b), a distance from the actual coating is ensured, which distance prevents abrasive particles contained in the polishing slurry or previously removed nanomaterials from acting on the coating with pressure.

A comparable method is known from Shuo Han et al., "Controllable two-dimensional photonic crystal patterns fabricated by naosphere lithography", in J. Vac. Sci. Technol. B 23(4), July/August 2005, 1585-1558. With the known method, there is a two layer substrate, the upper layer being silicon oxide. After nanospheres have been decorated on the surface of the upper layer, the nanospheres are thinned using oxygen plasma, thereby leaving the upper layer unaffected. In a next step, a metal mask is applied to the thinned nanospheres and the surface of the upper layer exposed between said nanospheres.

Only thereafter, the nanospheres are removed in chloroform with ultrasonication. In a next step, the silicon oxide layer is etched, and thereafter the substrate is etched.

Thus, what is different with the inventive method is, that in step b) not only the nanomaterials but also the substrate is etched. This has the further effect that when removing the nanomaterials, the metal mask is farther away from the nanospheres than with the known method. This makes it possible to remove the nanospheres by efficient technologies without having the risk to destroy or even affect the metal mask.

Furthermore, the novel method makes it possible to choose the size of the nanomaterials used independently of the coating layer thickness sought and thus to transfer smaller structures into the substrate than is possible by the known methods.

Furthermore, the novel method produces a negative mask which, in comparison with the methods known in the prior art, is insensitive to mechanical actions on the surface.

In one embodiment it is preferred for the substrate to have a first layer and at least one further underlying layer, the decorating nanomaterials lying on the first layer.

What is advantageous in this case is that by means of the first layer, through the choice of a suitable material, a three-dimensional surface can be produced more easily by means of the processability of the nanomaterials and of the first layer being coordinated with one another. Thus, by means of a suitable etching method, the decorated surface can be processed in such a way that e.g. only the substrate or only the nanomaterials are removed. Furthermore, it is also possible to choose the materials and the etching method in such a way that both the nanomaterials and the substrate are removed in a specific ratio with respect to one another.

This is possible in particular also when provision is made for transferring structures into one or a plurality of further layers of the substrate by the novel method, the further layers having an unfavourable etchability with respect to the nanomaterials.

What is furthermore advantageous is that with a substrate comprising two or more layers, arrangements in which the different layers have different properties can be produced by means of the novel method. Such properties can be for example a high electrical conductivity, a high insulation effect, chemical properties or structural properties such as high or low elasticity or tearing resistance.

In the case of the novel method it is also possible to form the first and the further layers of the substrate in different suitable material combinations, for example of substances from the group metal, silicon, glass, ceramic, polymer or mixed forms thereof.

In one embodiment it is preferred for the first layer to contain a polymer. In particular, it is preferred in this case for the polymer to be at least partly composed of polyimide.

What is advantageous in this case, firstly, is that a polymer can be applied uniformly to an underlying layer well by means of conventional coating methods.

What is furthermore advantageous is that polymers can be processed well by means of conventional etching methods. A further advantage can be seen in the fact that polyimide, for example, has a very high electrical insulation effect. Consequently, the method according to the invention makes it possible to produce a three-dimensionally patterned layer having a very high insulation effect such as is used for example in the production of semiconductor elements.

Furthermore, it is preferred for the nanomaterials to form a periodic arrangement.

What is advantageous in this case is that, by means of the production of a periodic arrangement, for example a two-dimensional crystal composed of spherical structures, a three-dimensional structure in the first layer or the substrate can be produced which has high and deep regions or pores which are clearly defined in terms of size and arrangement with respect to one another.

What is furthermore advantageous is that such a structure can be produced on large areas, with the result that the method according to the invention can be used to produce a defect-free three-dimensionally patterned surface even on a large area scale through to the metres scale.

In one embodiment it is preferred for the nanomaterials to have a size of 1 nm to 1000 nm in the direction of their smallest extent.

What is advantageous in this case is that with nanomaterials of small dimensions, which can be less than 100 nm, for example, with the method according to the invention it is possible to transfer smaller structures to a substrate than is possible with the method known in the prior art.

Furthermore, it is preferred for the nanomaterials to comprise polystyrene particles.

What is advantageous in this case is that polystyrene particles can easily be produced in a defined size and are thus readily and comparatively expediently available in the required quality.

It is also conceivable to use other nanomaterials comprising one or more substances from the group copolymer, carbon, metal oxide or semiconductor. What is advantageous in this case is that different structures can be produced with different materials; thus, by way of example, self-assembling or -organizing copolymers can be used for producing shadow masks of different arrangements. With carbon-based nanomaterials it is then possible to produce not only spherical structures but rather also nanotubes and further structures which can form periodic arrangements. Furthermore, it is possible to utilize the incorporation of magnetic materials for the assembly of nanomaterials by means of a magnetic field.

Furthermore, it is preferred for the etching in step b) to be effected by means of a dry etching method. In particular, it is preferred for the etching in step b) to be effected by means of plasma etching.

What is advantageous in this case firstly is that little physical influencing horizontally with respect to the processed surface occurs in a dry etching method, with the result that the decorating nanomaterials are not redistributed or detached from the surface by the action of a flowing liquid.

In this case, the patterning of the surface can be adapted to the different requirements through the choice of predominantly isotropic or predominantly anisotropic etching methods. Thus, it is possible, for example, to etch the decorating nanomaterials in small fashion in an isotropic etching method and at the same time to provide the first layer with a three-dimensional structure that is rather rounded in cross section. By contrast, with a substantially anisotropic etching method it is possible to produce in the substrate three-dimensional structures having parallel walls running substantially perpendicular to the surface. It is also conceivable in this case to combine substantially isotropic and substantially anisotropic etching methods in step b).

In one embodiment it is preferred for the nanomaterials to be reduced in size in step b).

What is advantageous in this case is that, by means of etching the nanomaterials in small fashion in the first etching step b), it is possible to produce a defined minimum distance between the columns of the first layer that are produced in step b).

In one embodiment it is preferred if in step c) the coating is applied by spraying.

What is advantageous in this case is that spraying methods suitable for coating nanostructured surfaces can be employed on a large-area scale.

In one embodiment it is preferred if in step c) the coating is applied by means of physical or chemical vapour deposition.

What is advantageous in this case is that it is possible to apply a coating with high uniformity by means of physical or chemical vapour deposition methods, for example sputtering or thermal evaporation. Moreover, no or only few inclusions are produced by means of these coating methods.

This enumeration should not be understood as exhaustive. Further coating methods such as, for example, thermal spraying, electrolytic methods or lacquering methods can likewise be combined with the method according to the invention.

In one embodiment it is preferred for a coating having a layer thickness of 1 nm to 10 μm to be applied in step c).

What is advantageous in this case is that in the method according to the invention the thickness of the applied coating is not upwardly limited by the size of the nanomaterials. Consequently, it is possible to apply a thicker layer than is possible with the conventional methods of particle lithography.

In one embodiment it is preferred for a coating which is at least partly composed of metal to be applied in step c).

Conventional metals are e.g. titanium, aluminium, platinum, tantalum, chromium, molybdenum or iron, where this enumeration should not be understood as exhaustive.

Furthermore, it is preferred for a coating which is at least partly composed of silicon nitride to be applied in step c).

It is furthermore preferred if in step d) the nanomaterials are removed by mechanical or chemical mechanical polishing.

What is advantageous in this case is that, unlike the methods known in the prior art, mechanical or chemical mechanical polishing ensures complete removal of the nanomaterials from the three-dimensional surface produced.

In this connection, it is preferred if in step d) a roller is used that preferably has a surface covered with an adhesive, or if in an alternative embodiment an adhesive film is arranged and advanced or moved between the roller and the nanomaterials to be removed.

The advantage here is that nanomaterials removed from the surface stick to the adhesive and are thus easily transported away from the three-dimensional surface.

Generally it is preferred if in step d) the three-dimensional surface structure of the first layer acts as a spacer between mechanical means for polishing and the coating.

What is advantageous in this case is that the vertical distance between the coating surface and the surface of the columns formed by the first layer can be set in almost any desired fashion by means of the type and duration of the etching method in step b) and also by means of the thickness of the coating applied in step c).

Consequently, it is possible to produce a suitable distance between coating surface and polishing fleece or polishing roller in order to prevent damage to the deeper coating surface depending on the size of the abrasive particles or nanomaterials used.

In one embodiment it is preferred if in step e) the coating applied in step c) acts as an etching mask.

What is advantageous in this case is that, in a second etching method, the columns of the first layer previously functioning as spacers can be removed without surrounding material simultaneously being removed.

Furthermore, it is possible in this way to produce structures in the first or one or more of the further layers which lie below the level of the coating applied in step c).

In this case, it is preferred for the etching in step e) to be effected by means of a dry etching method and/or wet etching method.

What is advantageous in this case firstly is that in a dry etching method, in particular a plasma etching method, an anisotropic etching of the first layer and, if appropriate, of the underlying substrate is effected, while an isotropic method, such as a suitable wet etching method, for example, can cause a detachment of the coating by means of the dissolution of the first layer. A method sequence in which e.g. in step e) firstly an anisotropic etching method is effected and the etching mask is subsequently removed by means of an isotropic method is also conceivable.

In one embodiment it is preferred if in step e) structures are etched only into the first layer.

What is advantageous in this case is that the novel method makes it possible to produce a polymer structure having a high insulation effect, for example, with a three-dimensionally nanostructured surface and embedded coating portions for example of a metallic conductor.

In another embodiment it is preferred if in step e) structures are etched into one or a plurality of further layers.

What is advantageous in this case is that, by means of anisotropic etching methods, materials which are not accessible to a coating method as in step c) can be provided with a surface according to the invention.

It is furthermore advantageous that in this way it is possible to produce structures in a substrate having a larger layer thickness than is possible by coating.

In one embodiment it is preferred if after step e) the first layer is detached from the second layer.

What is advantageous in this case is that very thin nanostructured materials can be produced by such a method, and that during the preceding processing steps the materials are less susceptible to deformations by physical effects or thermal influences.

The present invention furthermore relates to a surface comprising nanostructures, which surface has been produced according to a method according to the invention.

The abovementioned advantages and properties of the method according to the invention are also applicable, of course, to the surface itself that is produced according to a method according to the invention.

Such surface structures according to the invention can be used for example as membranes for nanofiltration methods, in electrodes or biosensors. However, diverse possibilities for use, for example in surface finishing, are furthermore conceivable as well.

It is also conceivable to use a surface produced according to the invention as a shadow mask in photolithography methods or as a stamp for nanoimprinting.

In view of the above, the invention furthermore relates to a membrane comprising a surface that has been produced according to a method according to the invention, an electrode arrangement, a biosensor, and also a device having a membrane, an electrode arrangement, a biosensor and/or a surface with a surface produced according to a method according to the invention.

Further advantages are evident from the accompanying description.

BRIEF DESCRIPTION OF THE DRAWINGS

It goes without saying that the features mentioned above and those yet to be explained below can be used not only in the combination respectively specified, but also in other combinations or by themselves, without departing from the scope of the present invention.

The method according to the invention for transferring nanostructures into a substrate is illustrated in the figures, in which.

DETAILED DESCRIPTION OF A PREFERRED EMBODIMENT

Figure 1:
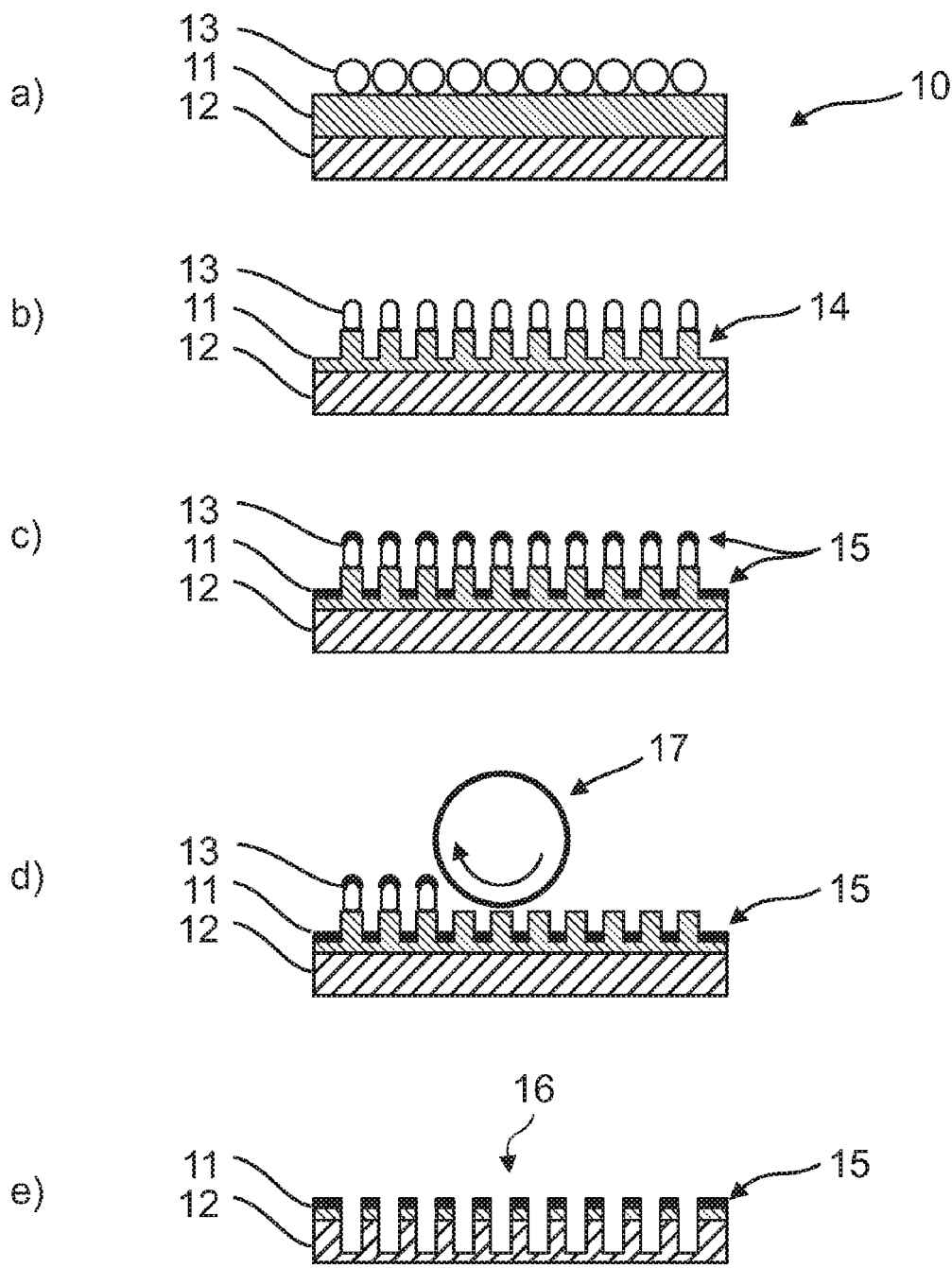
FIG. 1 shows by way of example the steps of the method according to the invention.

FIG. 1 illustrates the method according to the invention in exemplary steps, wherein in step a) a substrate 10 having a first layer 11 and a second layer 12 is decorated with nanomaterials 13. Step a) is followed by a first etching step b), in which a three-dimensional structure with columns 14 is produced in the first layer 11 and at the same time the nanomaterials 13 are reduced in size. In step c) a coating 15 is then applied, which is borne both on the nanomaterials and in the valley regions of the three-dimensional structure of the first layer 11. The removal of the nanomaterials 13 by means of mechanical polishing by a polishing roller 17 follows in step d). In step e) a further anisotropic etching step is effected, by means of which three-dimensional structures 16 are transferred into the first layer 11 and the second layer 12.

Figure 2:
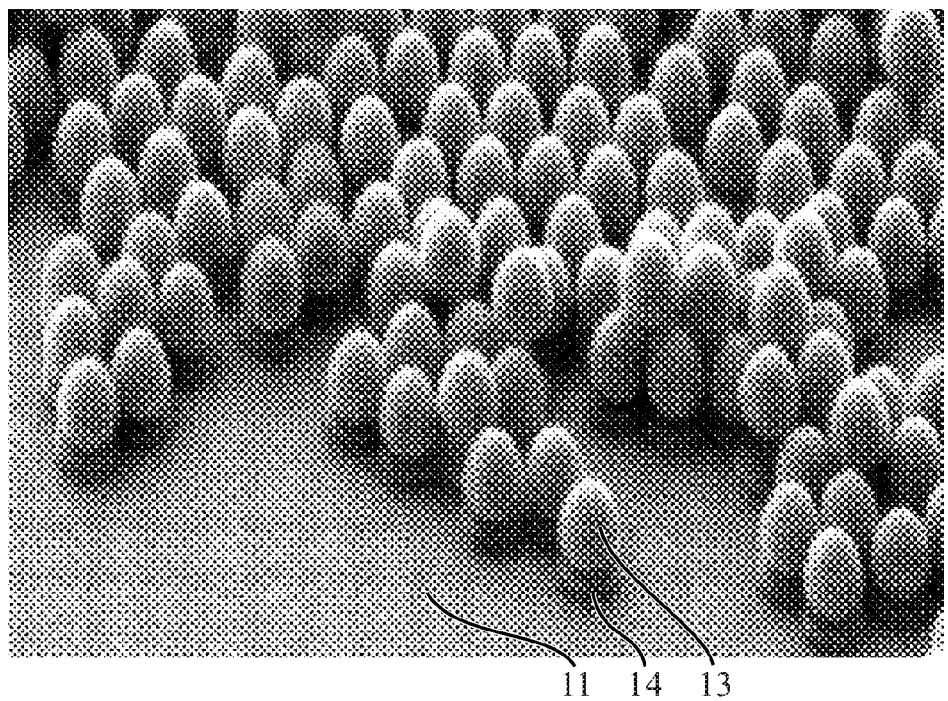
FIG. 2 shows a scanning electron micrograph of a surface coated with nanomaterials according to the invention after etching step b)

FIG. 2 shows a surface produced in the concrete embodiment, said surface having the state after etching step b). It can be seen in this case that the nanomaterials 13 used, polystyrene spheres in this case, arrange themselves in a largely two-dimensional periodic arrangement, and that they are situated on substrate columns 14 of the three-dimensional structure of the first layer 11 after etching step b).

Figure 3:
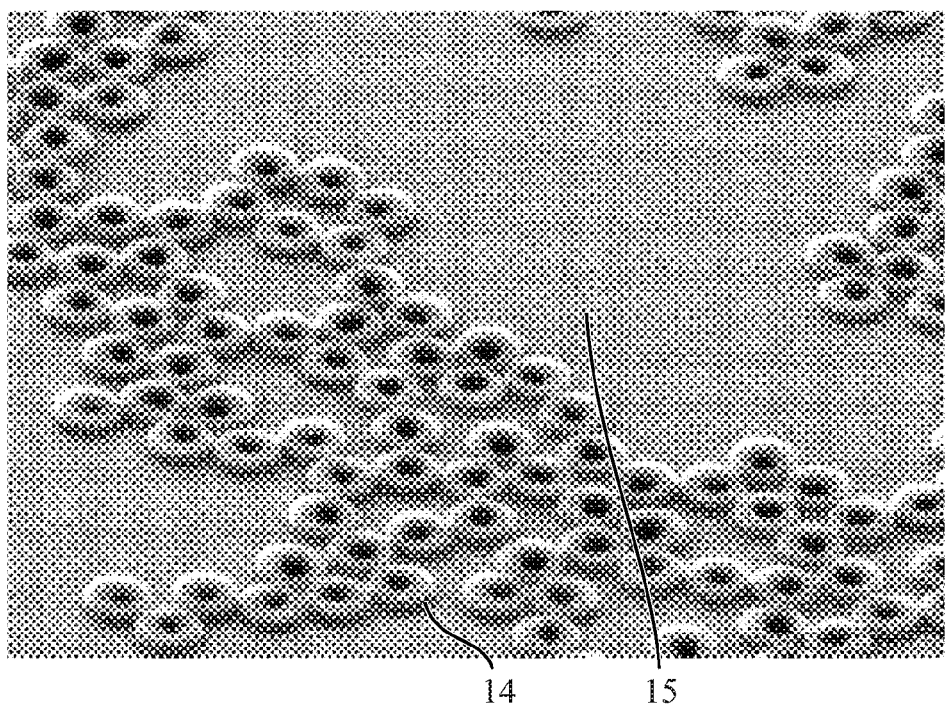
FIG. 3 shows a scanning electron micrograph of a surface produced according to the method according to the invention after the removal of the nanomaterials by means of mechanical polishing.

FIG. 3 shows a surface produced according to a method according to the invention, in which surface firstly a coating 15 with titanium was applied in a step c) and furthermore in a step d) the bearing nanomaterials were removed from the substrate columns 14. It can be seen in this case that the nanomaterials are completely removed from the surface by the mechanical polishing in step d), and furthermore that the coating 15 applied in step c) is not damaged by the mechanical polishing in step d).

In this embodiment, a 5 μm thick first layer composed of polyimide with an underlying glass layer having a thickness of 1 mm is used as the substrate.

In a first step a), the surface of the polyimide layer was decorated with nanomaterials. Polystyrene nanospheres having a diameter of 100 nm which were present in a 5% suspension in ethanol are used in this case.

After the solvent had been removed by evaporation, in a step b) by means of etching in oxygen plasma the surface thus decorated was contoured, as can be seen in FIG. 2. The bearing polystyrene spheres were simultaneously reduced in size in this step.

This was followed by a coating step c) in which titanium was applied to the surface thus produced, by means of sputtering. A titanium layer having a thickness of approximately 20 nm was produced in this case.

In a subsequent step, the decorating nanomaterials were removed by mechanical polishing.

The parameters and method steps in this case correspond moreover to those from the publication by Fischer and Zingsheim (1981) cited at the outset.

As can also be seen in FIG. 3, an uncovered surface from which the previously applied nanomaterials had been completely removed resulted after the mechanical polishing. Furthermore, the surface exhibited a contouring, in a fashion such that polyimide columns remained on the positions that had formerly been occupied by nanomaterials. A titanium layer had been produced inbetween the columns in the coating step, which titanium layer was not detrimentally affected by the removal of the nanomaterials by means of mechanical polishing.

Figure 4:
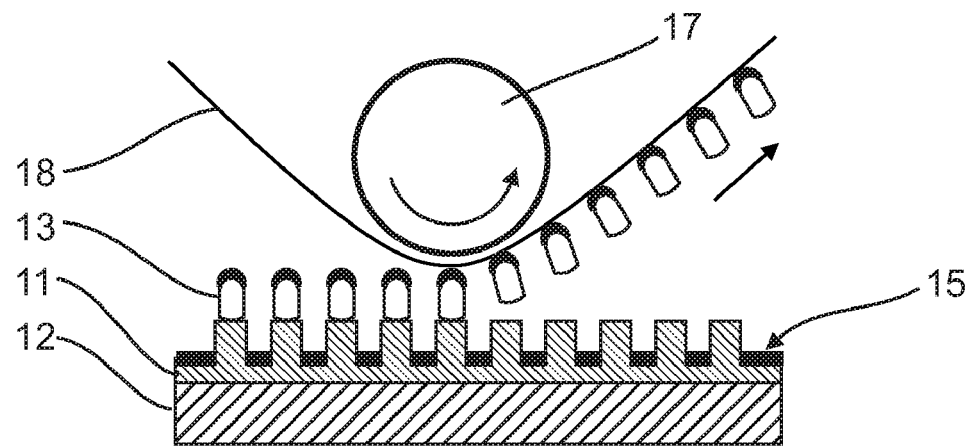
FIG. 4 shows an alternative embodiment for performing step d) of FIG. 1.

FIG. 4 shows an improvement to step d) from FIG. 1. Here, an adhesive film 18 is arranged and advanced between roller 17 and the nanomaterials 13, i.e. the polystyrene spheres to be removed. The spheres adhere to film 18 and are thus removed from the area of structured surface.

Figure 5:
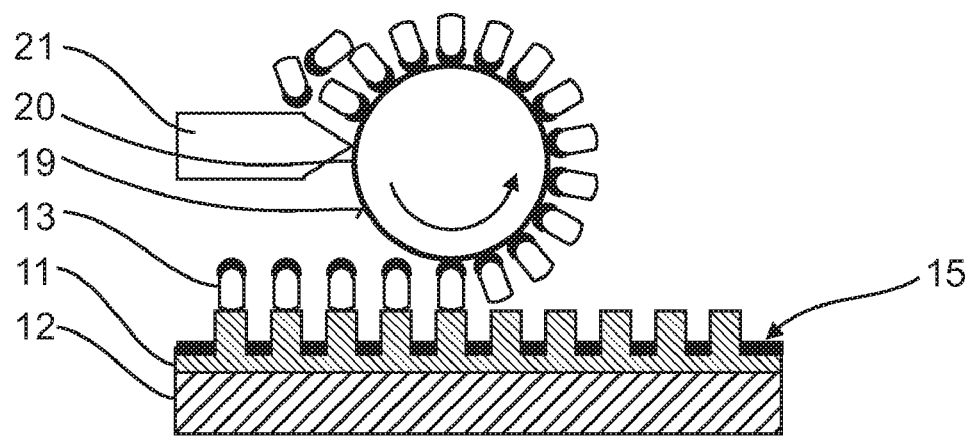
FIG. 5 shows a further embodiment for performing step d) of FIG. 1.

In a further embodiment shown in FIG. 5, roller 17 has its surface 19 covered with an adhesive 20, indicated in dashed lines. Nanospheres 13 caught by adhesive 20 are stripped of by wiper 21.

The invention claimed is:

1. A method for transferring nanostructures into a substrate, comprising the following order of steps:
    a) decorating said substrate with nanomaterials;
    b) etching the substrate;
    c) applying a coating;
    d) removing the nanomaterials; and
    e) etching the substrate to thereby transfer the nanostructures into the substrate.

2. The method of claim 1, wherein the nanomaterials form periodic arrangements.

3. The method of claim 1, wherein the nanomaterials have a size of 1 nm to 1000 nm in the direction of their smallest extent.

4. The method of claim 1, wherein the nanomaterials comprise polystyrene particles.

5. The method of claim 1, wherein in step b) the nanomaterials are reduced in size.

6. The method of claim 1, wherein in step c) the coating is applied by spraying.

7. The method of claim 1, wherein in step c) a coating having a layer thickness of 1 nm to 10 μm is applied.

8. The method of claim 1, wherein the coating is at least partly composed of metal.

9. The method of claim 1, wherein the coating is at least partly composed of silicon nitride.

10. The method of claim 1, wherein in step d) the nanomaterials are removed by mechanical or chemical mechanical polishing.

11. The method of claim 1, wherein in step e) the coating applied in step c) acts as an etching mask.

12. The method of claim 1 wherein the etching in step e) is effected by means of a wet etching method.

13. The method of claim 1, wherein applying a coating comprises applying a coating to the substrate such that the coating is positioned at a level below a level of an original upper surface of the substrate.

14. The method of claim 1, wherein etching the substrate in step b) comprises etching the nanomaterials in addition to etching the substrate.

15. The method of claim 1, wherein in step b) the nanomaterials are also etched.

16. The method of claim 15, wherein in step d) the nanomaterials are removed by mechanical or chemical mechanical polishing.

17. The method of claim 1, wherein said etching in step b) is effected by means of a dry etching method.

18. The method of claim 17, wherein said etching in step b) is effected by means of plasma etching.

19. The method of claim 1, wherein in step c) the coating is applied by means of physical or chemical vapour deposition.

20. The method of claim 6, wherein in step c) the coating is applied by thermal evaporation.

21. The method of claim 1, wherein in step d) a roller is used.

22. The method of claim 21, wherein said roller has a surface covered with an adhesive.

23. The method of claim 21, wherein an adhesive film is arranged between the roller and the nanomaterials to be removed.

24. The method of claim 1 wherein the etching in step e) is effected by means of a dry etching method.

25. The method of claim 24, wherein the etching in step e) is effected by means of plasma etching.

26. The method of claim 1, wherein the substrate has a first layer and at least one further layer, the decorating nanomaterials being on the first layer.

27. The method of claim 26, wherein said first layer has a three-dimensional surface structure and wherein in step d) said three-dimensional surface structure of the first layer acts as a spacer between the mechanical means for removing the nanomaterials by mechanical or chemical mechanical polishing and the coating.

28. The method of claim 26, wherein in step e) the nanostructures are etched into the first layer.

29. The method of claim 26, wherein in step e) the nanostructures are etched into one or a plurality of further layers.

30. The method of claim 26, wherein following step e) the first layer is detached from the second layer.

31. The method of claim 26, wherein the first layer contains a polymer.

32. The method of claim 31, wherein the polymer is at least partly comprised of polyimide.

33. A method for transferring nanostructures into a substrate, comprising the following order of steps:
   a) decorating said substrate with nanomaterials;
   b) etching the substrate to produce a three-dimensional surface structure;
   c) applying a coating to the three-dimensional surface structure;
   d) removing the nanomaterials from the three-dimensional surface structure by mechanical or chemical-mechanical polishing using mechanical means, whereby said three-dimensional surface structure acts as a spacer between said mechanical means and said coating; and
   e) etching the substrate to thereby transfer the nanostructures into the substrate.

34. A method for transferring nanostructures into a substrate, comprising the following order of steps:
   a) decorating said substrate with nanomaterials;
   b) etching the substrate;
   c) applying a coating;
   d) removing the nanomaterials by a roller; and
   e) etching the substrate to thereby transfer the nanostructures into the substrate.

35. A method for transferring nanostructures into a substrate having a first layer and at least one further layer, comprising the following order of steps:
   a) decorating the first layer of the substrate with nanomaterials;
   b) etching the substrate;
   c) applying a coating;
   d) removing the nanomaterials; and
   e) etching the substrate to thereby transfer the nanostructures into the substrate.

* * * * *